US006559889B2

United States Patent
Tanaka et al.

(10) Patent No.: US 6,559,889 B2
(45) Date of Patent: *May 6, 2003

(54) SOLID-STATE IMAGING APPARATUS WITH LOWERED OVERFLOW DRAIN BIAS, METHOD FOR DRIVING SAME AND CAMERA USING SAME

(75) Inventors: Hiroaki Tanaka, Kanagawa (JP); Isao Hirota, Kanagawa (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/933,533

(22) Filed: Sep. 18, 1997

(65) Prior Publication Data

US 2001/0010553 A1 Aug. 2, 2001

(30) Foreign Application Priority Data

Sep. 20, 1996 (JP) .............................. 8-249652

(51) Int. Cl.[7] .............................. H04N 5/335
(52) U.S. Cl. .................. 348/299; 348/317; 348/314; 348/362
(58) Field of Search ................. 348/296, 297, 348/298, 299, 311, 312, 314, 317, 362; 257/230, 229

(56) References Cited

U.S. PATENT DOCUMENTS

| 4,597,015 A | * | 6/1986 | Johnson ................... 348/230.1 |
| 4,626,915 A | * | 12/1986 | Takatsu ....................... 348/299 |
| 4,782,394 A | * | 11/1988 | Hieda et al. ................. 348/296 |
| 5,157,498 A | * | 10/1992 | Suga et al. .................. 348/254 |
| 5,276,520 A | * | 1/1994 | Hawkins et al. ............. 257/223 |
| 5,424,529 A | * | 6/1995 | Hashimoto et al. ......... 348/302 |
| 5,464,996 A | * | 11/1995 | Hynecek ...................... 257/223 |
| 5,714,753 A | * | 2/1998 | Park .............................. 348/297 |
| 5,774,182 A | * | 6/1998 | Mutoh et al. ................ 348/311 |
| 5,828,407 A | * | 10/1998 | Suzuki ......................... 348/312 |
| 5,978,024 A | * | 11/1999 | Lee .............................. 348/299 |

OTHER PUBLICATIONS

Patent Abstracts of Japan, vol. 098, No. 005, Apr. 30, 1998 & JP10–103748 A (Sony Corp.), Jan. 16, 1998.

Patent Abstracts of Japan, vol. 097, No. 009, Sep. 30, 1997 & JP09–121310 A (Sony Corp.), May 6, 1997.

* cited by examiner

*Primary Examiner*—Tuan Ho
(74) *Attorney, Agent, or Firm*—Sonnenschein, Nath & Rosenthal

(57) ABSTRACT

In a CCD imaging device in which sensor sections have the vertical overflow drain (OFD) structure, a substrate bias control signal is applied to the base of a bipolar transistor via a resistor to turn on the transistor at least during a signal charge readout period. As a result, the base potential of a bipolar transistor that constitutes a clamping circuit is lowered, whereby a substrate bias that is output from a substrate bias generation circuit is lowered. Thus, the potential of an overflow barrier in the sensor sections is reduced.

29 Claims, 9 Drawing Sheets

ODD FIELD          EVEN FIELD

ODD FIELD          EVEN FIELD

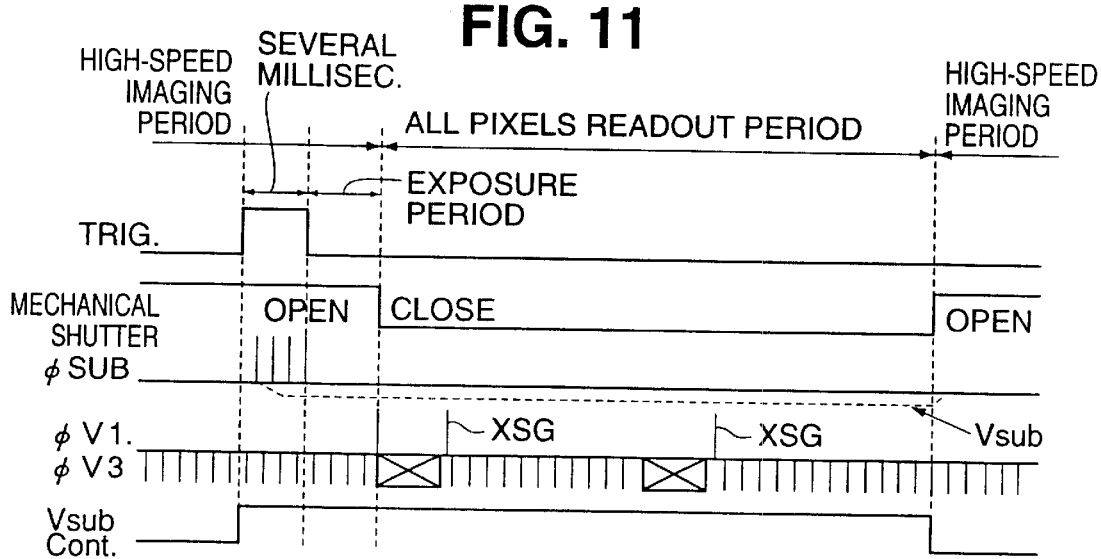
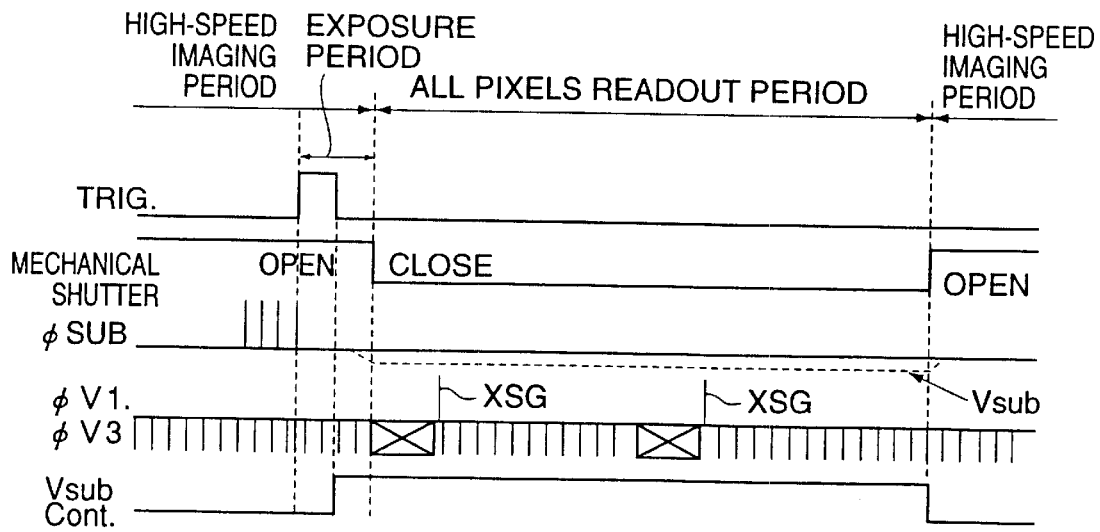

SOLID-STATE IMAGING APPARATUS WITH LOWERED OVERFLOW DRAIN BIAS, METHOD FOR DRIVING SAME AND CAMERA USING SAME

BACKGROUND OF THE INVENTION

The present invention relates to a solid-state imaging apparatus, a driving method therefor, and a camera using a solid-state imaging apparatus as an imaging device. In particular, the invention relates to a solid-state imaging apparatus that uses a CCD (charge coupled device) solid-state imaging device having the overflow drain (OFD) structure (hereinafter referred to as "CCD imaging device"), a driving method therefor, and a camera that is equipped with a light interrupting means such as a mechanical shutter.

As for readout schemes of the CCD imaging device, FIG. 1 shows what is called the field readout scheme which realizes interlace scanning by causing each pixel to accumulate signal charge for $\frac{1}{60}$ second (corresponding to one field), and mixing, in the vertical CCDs, signal charges read out from the respective pixels such that signal charges of two pixels adjacent to each other in the vertical direction are mixed together, with the manner of combining two pixels in the vertical direction for mixing changed for odd fields and even fields. FIG. 2 shows what is called the frame readout scheme in which signal charges of odd lines and signal charges of even lines are read out alternately on a field-by-field basis with an accumulation time of $\frac{1}{30}$ second. FIG. 3 shows what is called the all pixels readout scheme in which signal charges of the respective pixels are read out independently at the same time point without being mixed in the vertical CCDs.

Among the above readout scheme, the field readout scheme is suitable for use in a video camera or the like. This is because the signal charge accumulation time in each pixel of the field readout scheme is $\frac{1}{60}$ second, i.e., a half of $\frac{1}{30}$ second of the frame readout scheme, and hence the field readout scheme enables satisfactory imaging of moving pictures. On the other hand, the field readout scheme has a drawback of low vertical resolution, which results from the mixing of signal charges of two pixels that are arranged vertically. For this reason, the frame readout scheme with the use of a mechanical shutter or the all pixels readout scheme is used in an electronic still camera which also requires high vertical resolution.

In the frame readout scheme, signals of two fields are needed to obtain one image (one-frame image). On the other hand, to obtain one image by a single exposure as is the case of an electronic still camera, it is necessary that an image remain the same in two fields. To this end, it is necessary to effect light interruption after completion of an exposure by using a light interrupting means such as a mechanical shutter.

However, when light interruption is effected after completion of an exposure in a CCD imaging device having the overflow drain structure, part of the signal charges are emitted to the overflow drain in the following manner. That is, as time elapses, due to thermal fluctuation, signal charges having energies higher than the Fermi level of the accumulated signal charges go over the overflow barrier until the Fermi level becomes close to a given value.

Therefore, the saturation signal charge amount Qs decreases over time during a period from closing of the mechanical shutter to readout of signal charges. In the second field, the period from closing of the mechanical shutter to readout of signal charges is longer than in the first field by a time corresponding to one field, and hence the saturation signal charge amount Qs further decreases as much. Thus, a level difference occurs between the saturation signal charge amounts Qs of the first and second fields. The decrease in saturation signal charge amount Qs is unfavorable because it will deteriorate such characteristics as the S/N ratio and the dynamic range.

SUMMARY OF THE INVENTION

The present invention has been made in view of the above problems in the art, and an object of the invention is therefore to provide a solid-state imaging apparatus, a driving method therefor, and a camera which prevent such characteristics as the S/N ratio and the dynamic range from being deteriorated due to decrease in saturation signal charge amount that occurs in the period from completion of an exposure to readout of signal charges.

A solid-state imaging apparatus according to the invention comprises a solid-state imaging device having a plurality of sensor sections that have an overflow drain structure and are arranged in matrix form, and a charge transfer section for transferring signal charges read out from the sensor sections; and a driving system for performing a drive so as to lower an overflow drain bias of the solid-state imaging device at least during a signal charge readout period in a given operation mode.

In a solid-state imaging apparatus comprising a solid-state imaging device having a plurality of sensor sections that have an overflow drain structure and are arranged in matrix form, and a charge transfer section for transferring signal charges read out from the sensor sections, a driving method according to the invention lowers an overflow drain bias of the solid-state imaging device at least during a signal charge readout period in a given operation mode.

A camera according to the invention comprises a solid state-imaging apparatus comprising a solid-state imaging device having a plurality of sensor sections that have an overflow drain structure and are arranged in matrix form, and a charge transfer section for transferring signal charges read out from the sensor sections, and a driving system for performing a drive so as to lower an overflow drain bias of the solid-state imaging device at least during a signal charge readout period in a given operation mode; an optical system for guiding incident light to an imaging area of the solid-state imaging device; and light interrupting means for determining an exposure period by interrupting the incident light to prevent it from reaching the imaging area of the solid-state imaging device.

With the above constitution, part of signal charges in the sensor sections are released to the overflow drain over time during light interruption. To avoid this phenomenon, the overflow drain bias is lowered in anticipation of the above reduction of signal charges at least during signal charge readout period. With this measure, the saturation signal charge amount (in terms of the value before it decreases over time during the light interruption) can be increased in anticipation of the amount of its reduction. As a result, a desired saturation signal charge amount can be secured.

BRIEF DESCRIPTION OF THE DRAWINGS

FIG. 11 is a timing chart of specific example-1;

FIG. 12 is a timing chart of specific example-2;

DESCRIPTION OF THE PREFERRED EMBODIMENTS

An embodiments of the present invention will be hereinafter described with reference to the drawings. The following embodiment is directed to a case where the invention is applied to an interline transfer (IT) type CCD imaging device.

Figure 1:
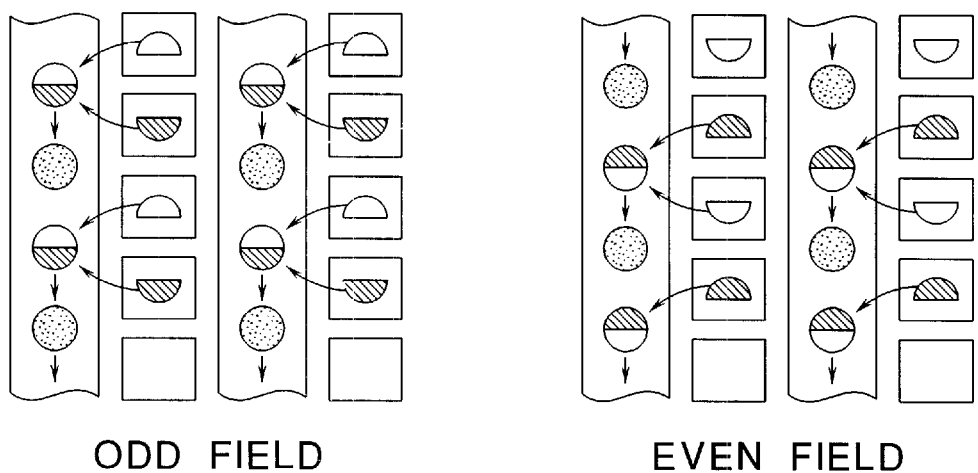
FIG. 1 illustrates the field readout scheme.
Figure 2:
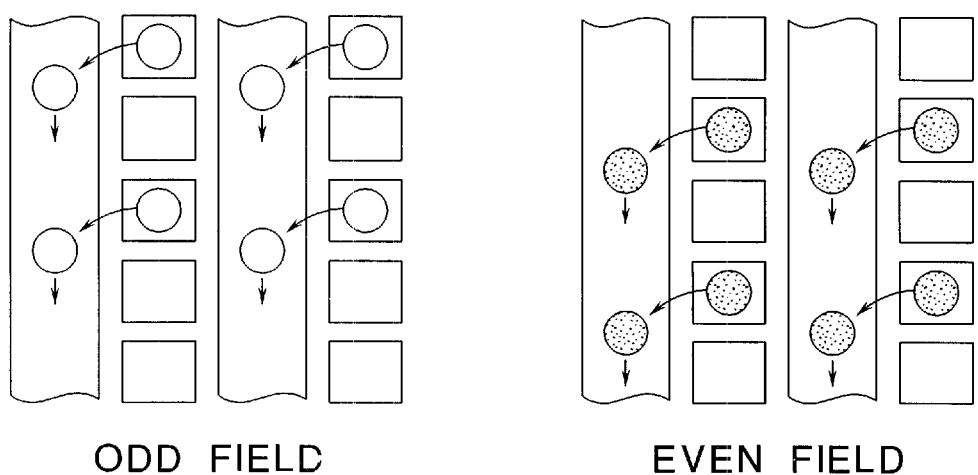
FIG. 2 illustrates the frame readout scheme.
Figure 3:
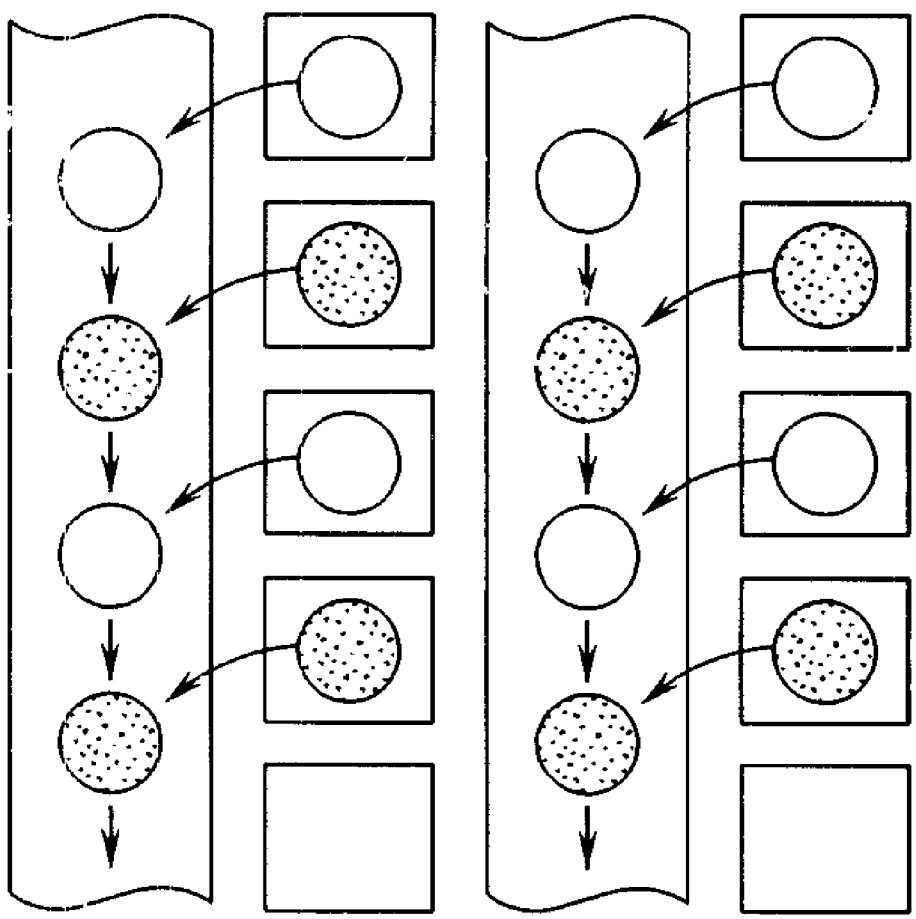
FIG. 3 illustrates the all pixels readout scheme.
Figure 4:
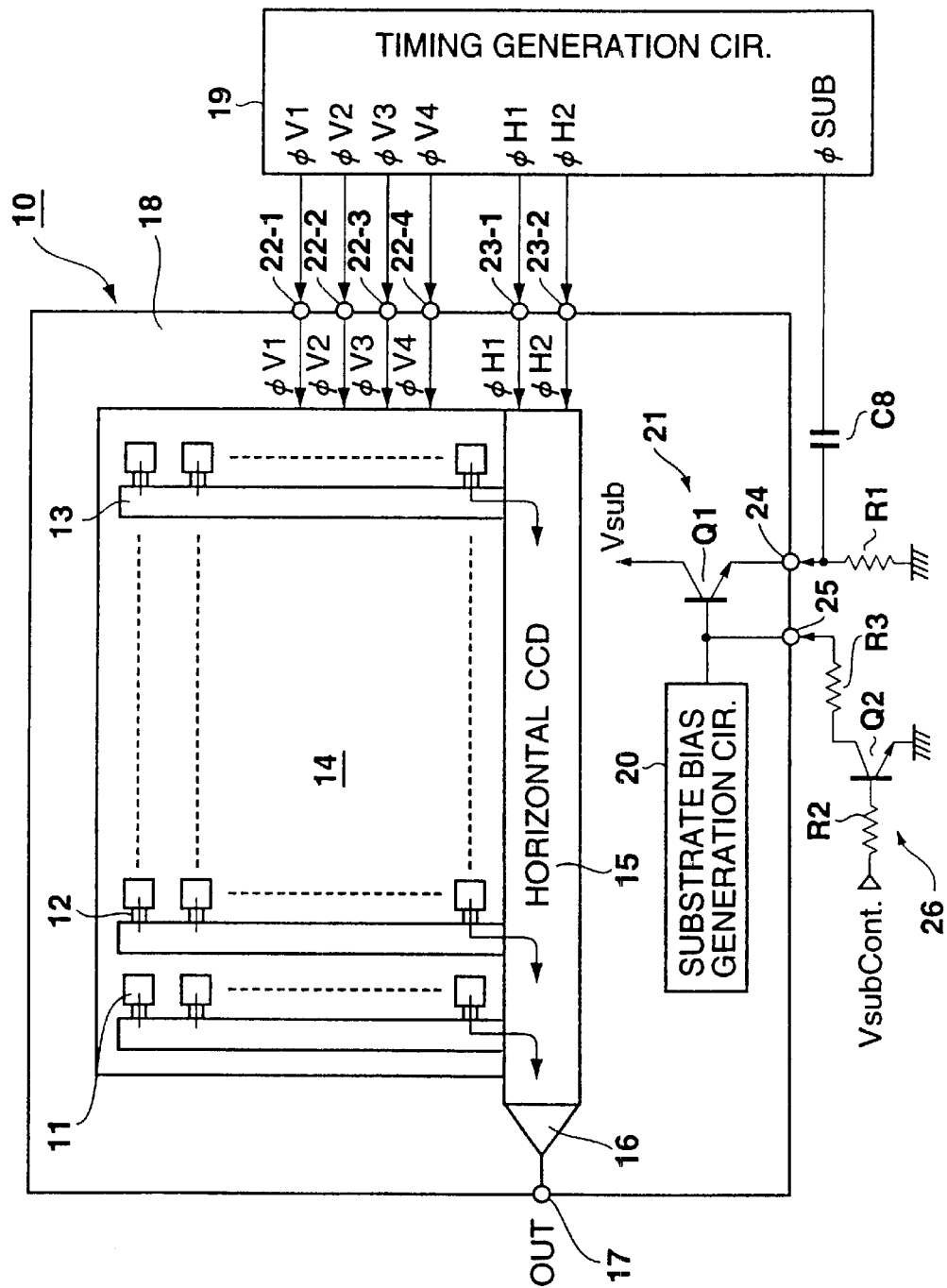
FIG. 4 shows a general configuration of a solid-state imaging apparatus according to the present invention.

FIG. 4 shows a general configuration of an example of a solid-state imaging apparatus according to the invention. As shown in FIG. 4, an imaging area 14 consists of a plurality of sensor sections 11 that are arranged in the row (horizontal) direction and the column (vertical) direction, i.e., in matrix form, and serve to convert incident light into signal charge of an amount corresponding to its light quantity and store the signal charge, and a plurality of vertical CCDs 13 that are provided for the respective vertical columns of the sensor sections 11 and serve to vertically transfer signal charges that are respectively read out from the sensor sections 11 by readout gate sections 12.

In the imaging area 14, each sensor section 11 is a pn-junction photodiode, for instance. A signal charge accumulated in each sensor section 11 is read out to the associated vertical CCD 13 when a read pulse XSG (described later) is applied to the associated readout gate section 12. Transfer-driven by 4-phase vertical transfer clock signals V$\phi$1-V$\phi$4, for instance, the vertical CCDs 13 sequentially transfer portions of read-out signal charges in the vertical direction such that each portion corresponding to one scanning line (one line) is transferred in a portion of each horizontal blanking period.

In the vertical CCDs 13, first-phase and third-phase transfer electrodes also serve as gate electrodes of the readout gate sections 12. Therefore, among the 4-phase vertical transfer clock signals V$\phi$1-V$\phi$4, the first-phase transfer clock signal V$\phi$1 and the third-phase transfer clock signal V$\phi$3 are set to have three values: a low level, a medium level, and a high level. A pulse of the third-value level, i.e., the high level, serves as a read pulse XSG to be applied to the read gate sections 12.

A horizontal CCD 15 is disposed under the imaging area 14 (as viewed in the FIG. 4). Signal charges are sequentially transferred from the plurality of vertical CCDs 13 to the horizontal CCD 15 such that signal charges corresponding to one line are transferred each time. Transfer-driven by 2-phase horizontal transfer clock signals H$\phi$1 and H$\phi$2, for instance, the horizontal CCD 15 sequentially transfers, in the horizontal direction, signal charges transferred from the vertical CCDs 13 such that signal charges of one line are transferred in a horizontal scanning period after the preceding horizontal blanking period.

A charge-to-voltage conversion section 16 having a configuration of a floating diffusion amplifier, for instance, is provided at the transfer destination end of the horizontal CCD 15. The charge-to-voltage conversion section 16 sequentially converts signal charges that are horizontally transferred by the horizontal CCD 15 into a voltage signal and outputs it. After passing through an output circuit (not shown), the voltage signal is output to an external system from an output terminal 17 as a CCD output signal OUT which corresponds to the amount of incident light coming from an object.

The above-mentioned sensor sections 11, readout gate sections 12, vertical CCDs 13, horizontal CCD 15, and charge-to-voltage conversion section 16, and other components are formed on a semiconductor substrate 18 (hereinafter referred to simply as "substrate"). Thus, an interline transfer type CCD imaging device 10 is formed. The 4-phase vertical transfer clock signals $\phi$V1-$\phi$V4 and the 2-phase horizontal transfer clock signals $\phi$H1 and $\phi$H2 for driving the CCD imaging device 10 are generated by a timing generation circuit 19.

The 4-phase vertical transfer clock signals $\phi$V1-$\phi$V4 are supplied to the vertical CCDs 13 via terminals (pads) 22-1 to 22-4 that are formed on the substrate 18. The 2-phase horizontal transfer clock signals $\phi$H1 and $\phi$H2 are supplied to the horizontal CCD 15 via terminals 23-1 and 23-2. In addition to the above transfer clock signals, the timing generation circuit 19 generates various timing signals such as a shutter pulse $\phi$SUB for sweeping out signal charges stored in the sensor sections 11 to the substrate 18.

A substrate bias generation circuit 20 which generates a bias voltage Vsub (hereinafter referred to as "substrate bias") for biasing the substrate 18 is also formed on the substrate 18. The substrate bias Vsub generated by the substrate bias generation circuit 20 is applied to the substrate 18 via a transistor Q1. The function of the substrate bias Vsub will be described later.

Figure 5:
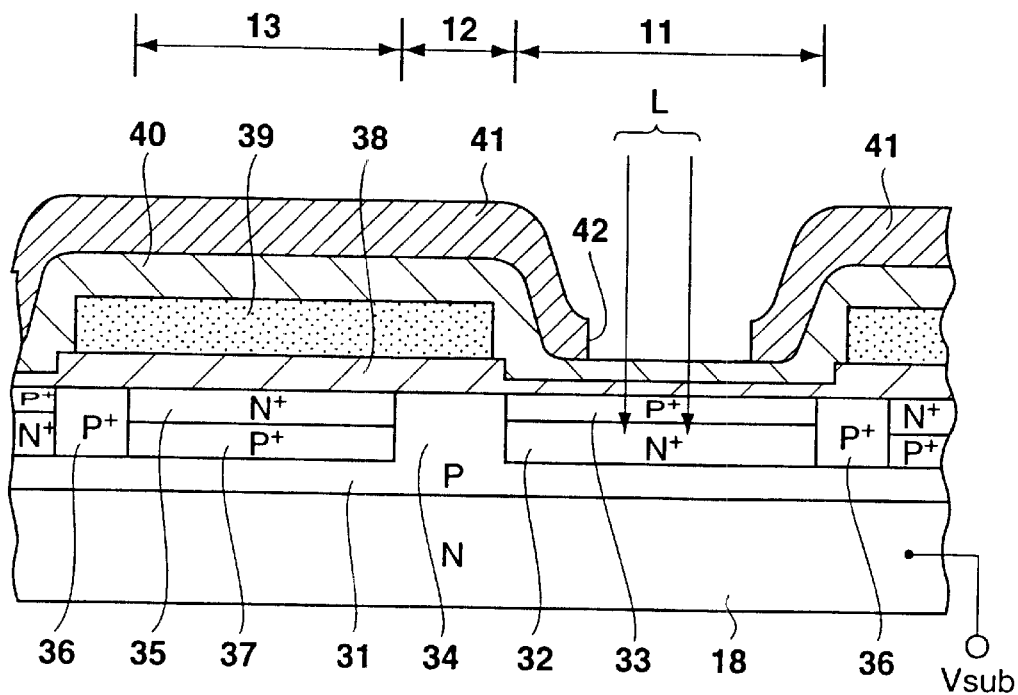
FIG. 5 is a sectional view showing a structure of a sensor section and its vicinity.

FIG. 5 is a sectional view showing a structure in the substrate depth direction of each sensor section 11 and its vicinity. As shown in FIG. 5, for example, a p-type well region 31 is formed on the surface of an n-type substrate 18. An n$^+$ signal charge storage region 32 is formed on the surface of the well region 31 and a p$^+$ hole storage region 33 is formed thereon, to constitute the sensor section 11 having what is called the HAD (hole storage diode) structure.

Figure 6:
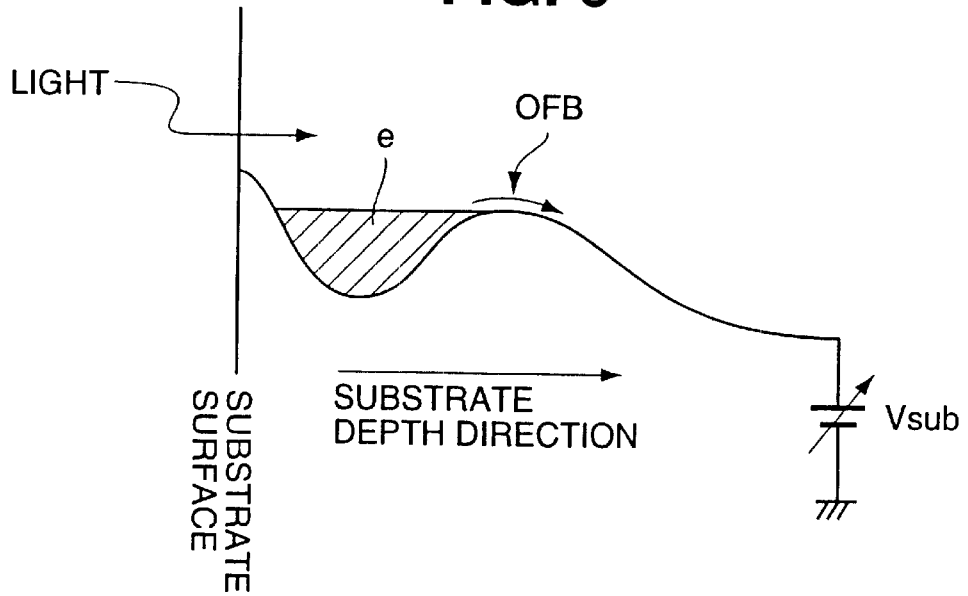
FIG. 6 is a diagram showing a potential profile of the sensor section in the substrate depth direction.

As shown in a potential profile diagram of FIG. 6, the amount of signal charge e accumulated in each sensor section 11 is determined by a potential barrier height of an overflow barrier OFB that is formed by the p-type well region 31. That is, the overflow barrier OFB determines the saturation signal charge amount Qs of signal charge stored in the sensor section 11. When the stored charge amount exceeds the saturation signal charge amount Qs, an excessive part of the charge goes over the potential barrier and is swept out to the substrate 18 side.

The sensor section 11 having what is called the vertical overflow drain structure is formed as described above. In the vertical overflow drain structure, the substrate 18 serves as an overflow drain. In the sensor section 11, while the saturation signal charge amount Qs is determined by an S/N characteristic of the device, the handlable charge amount of the vertical CCDs 13, and other factors, the potential of the overflow barrier OFB varies due to variations in manufacture. The potential of the overflow barrier OFB can be controlled by an overflow drain bias, i.e., the above-mentioned substrate bias Vsub.

An $n^+$ signal charge transfer region 35 and a $p^+$ channel stopper region 36 are formed on a lateral side of the sensor section 11 with a p-type region 34 that constitutes the readout gate 12 interposed in between. A $p^+$ impurity diffusion region 37 for preventing contamination by a smear component is formed under the signal charge transfer region 35. Further, a transfer electrode 39 made of polycrystalline silicon, for instance, is disposed over the signal charge transfer region 35 with a gate insulating film 38 interposed in between. Thus, the vertical CCD 13 is formed. The portion of the transfer electrode 39 located over the p-type region 34 also serves as a gate electrode of the readout gate section 12.

An Al (aluminum) light interruption film 41 is formed over the vertical CCD 13 so as to cover the transfer electrode 39 through an interlayer film 40. The Al light interruption film 41 is removed, by etching, selectively in a portion corresponding to the sensor section 11 to form an opening 42, through which external light L enters the sensor section 11. As described above, the substrate bias Vsub, which determines the amount of signal charge stored in the sensor section 11, i.e., determines the potential of the overflow barrier OFB, is applied to the substrate 18.

The substrate bias Vsub is set at an optimum value for each chip in the substrate bias generation circuit 20 shown in FIG. 4 in consideration of a variation in the potential of the overflow barrier OFB (see FIG. 6) in the sensor section 11 due to variations in manufacture of an individual device. After being subjected to impedance conversion by a bipolar transistor Q1, the substrate bias Vsub is applied to the substrate 18. The bipolar transistor Q1 is also formed on the substrate 18 together with the substrate bias generation circuit 20.

On the other hand, during an electronic shutter operation, a shutter pulse φSUB that is generated by the timing circuit 19 is DC-cut by a capacitor C and then applied to the emitter of the bipolar transistor Q1 via a terminal 24. The bipolar transistor Q1 constitutes a clamping circuit 21 for clamping the low level of the shutter pulse φSUB to the DC level of the substrate bias Vsub. A resistor R1 is provided between the terminal 24 and the ground.

An externally supplied substrate bias control signal Vsub-Cont. is applied to the base of a bipolar transistor Q2 via a resistor R2. The emitter of the bipolar transistor Q2 is grounded and its collector is connected to a terminal 25 via a resistor R3. The base of the bipolar transistor Q1 is connected to the terminal 25. The bipolar transistor Q2 and the resistors R2 and R3 constitute a driving system 26 that performs driving so as to temporarily reduce the substrate bias Vsub based on the substrate bias control signal Vsub-Cont.

More specifically, in the driving system 26, when the substrate bias control signal VsubCont. is at a low level, the bipolar transistor Q2 is off and hence the substrate bias Vsub generated by the substrate bias voltage generation circuit 20 is applied as it is to the substrate 18 via the bipolar transistor Q1. On the other hand, when the substrate bias control signal VsubCont. turns to a high level, the bipolar transistor Q2 is turned on to ground the base of the bipolar transistor Q1 via the resistor R3, so that the substrate bias Vsub generated by the substrate bias generation circuit 20 is subjected to potential reduction by a voltage corresponding to the resistance of the resistor R3.

Figure 7:
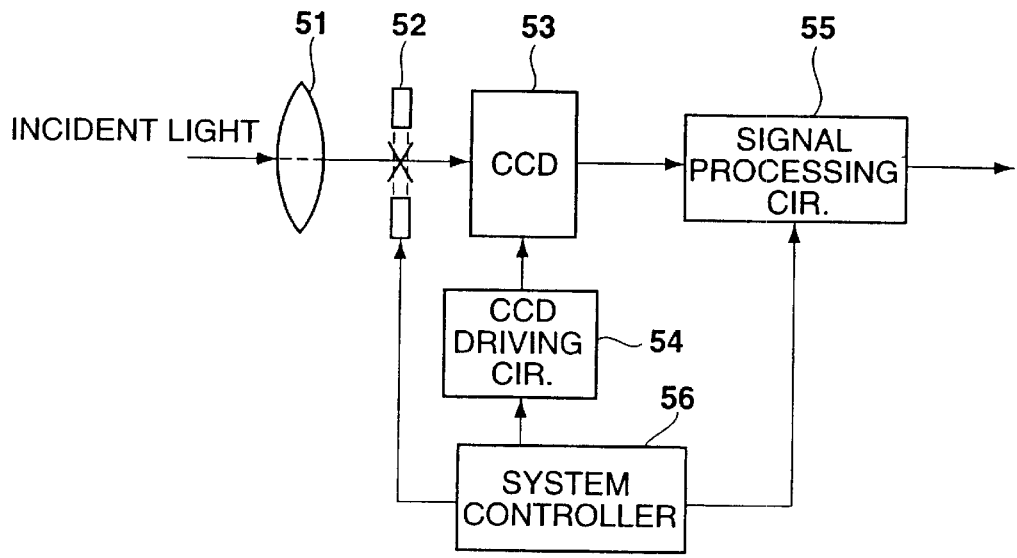
FIG. 7 shows a general configuration of a camera according to the invention.

FIG. 7 shows a general configuration of a camera according to the invention which uses, as an imaging device, the above-configured solid-state imaging apparatus of the embodiment. As shown in FIG. 7, light coming from an object (not shown) impinges on the imaging area of a CCD solid-state imaging device 53 via an optical system including a lens 51 and a mechanical shutter 52. The mechanical shutter 52 determines the exposure time by obstructing incidence of light on the imaging area of the CCD solid-state imaging device 53.

The above-described CCD solid-state imaging device of the embodiment is used as the CCD solid-state imaging device 53. The CCD solid-state imaging device 53 is driven by a CCD driving circuit 54 which includes the above-described timing generation circuit 19 and driving system 26. An output signal of the CCD solid-state imaging device 53 is subjected to various kinds of signal processing such as an automatic white balance adjustment in a signal processing circuit 55 of the next stage, and is thereafter output to an external system as an imaging signal. A system controller 56 performs an opening/closing control on the mechanical shutter 52, a control on the CCD driving system 54, a control on the signal processing circuit 55, and other controls.

Figure 8:
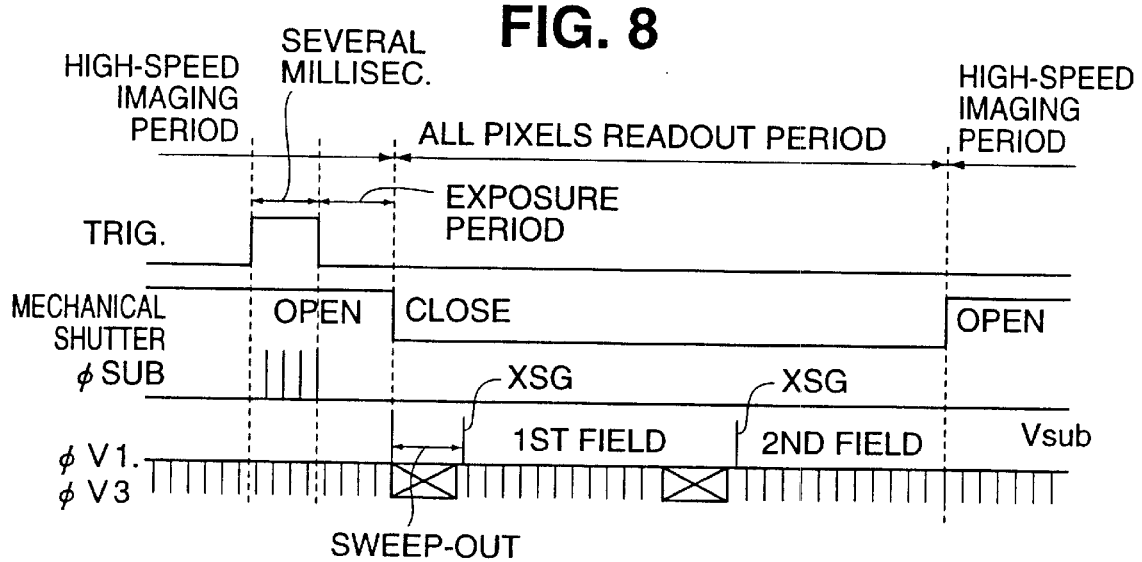
FIG. 8 is a timing chart for description of a basic operation of the camera of FIG. 7.

Next, a basic operation of the above-configured camera will be described with reference to a timing chart of FIG. 8.

First, when a shutter release button (not shown) is depressed, in response a trigger pulse TRIG. having a pulse width of several milliseconds is generated. Several shutter pulses φSUB are generated in the duration of the trigger pulse TRIG., whereby signal charges of all the sensor sections 11 are swept and discarded to the substrate 18. After a lapse of a given exposure period, the mechanical shutter 52 is closed and an all pixels readout period is started in which signal charges of all pixels are to be read out by frame readout, for instance.

In the all pixels readout period, first, charges in the vertical CCDs 13 are swept out by high-speed transfer driving of the vertical CCDs 13. Then, a read pulse XSG occurs in a vertical transfer clock signal φV1, whereby signal charges of the respective pixels of the first field are read out. After the readout of the first field signal charges, charges in the vertical CCDs 13 are again swept out by high-speed transfer driving. Then, a read pulse XSG occurs in a vertical transfer clock signal φV3, whereby signal charges of the respective pixels of the second field are read out.

Subsequently, the mechanical shutter 52 is opened and a high-speed imaging period is started. In the high-speed imaging period, various automatic controls are performed such as monitoring for displaying a picture being taken, an automatic iris control for adjusting the exposure by controlling the opening degree of an iris (not shown), an automatic focus control for adjusting the focus by controlling the position of the lens 51 in the optical axis direction, and an automatic white balance control for taking a white balance.

Figure 9:
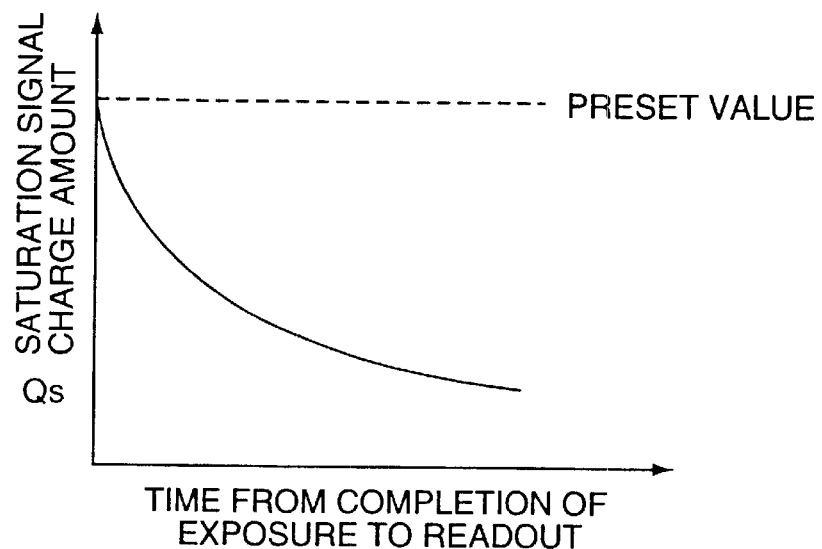
FIG. 9 is a characteristic diagram showing a relationship between the saturation signal charge amount Qs and the time from the completion of an exposure to the readout.

As described in the background section, during the period from the completion of an exposure to the readout of signal charges, the saturation signal charge amount Qs decreases because part of the saturation signal charges in the sensor sections 11 are released as time elapses. FIG. 9 shows a relationship between the saturation signal charge amount Qs and the time from the completion of an exposure to the readout of signal charges. The deteriorations of such characteristics as the S/N ratio and the dynamic range due to the reduction of the saturation signal charge amount Qs may be prevented by securing a potential barrier difference large enough to prevent saturation signal charges from being saturated over time. However, since the saturation signal charge amount Qs is determined by the handlable charge amount of the vertical CCDs 13, the blooming characteristic, and other factors, it is difficult to secure such a large potential barrier difference.

The deteriorations of such characteristics as the S/N ratio and the dynamic range due to the reduction of the saturation signal charge amount Qs can also be prevented by increasing in advance the saturation signal charge amount Qs (in terms of its value before it decreases over time) in anticipation of the amount of its reduction by lowering the above-mentioned substrate bias Vsub. Referring to FIG. 8, a consideration will be given to a case where the substrate bias Vsub is changed in all the periods. No problem occurs in the all pixels readout period for the following reasons. Even if a signal in excess of the handlable charge amount of the vertical CCDs 13 or blooming or a like component occurs in the exposure period, the related charges are swept out in the sweep-out period. Further, since the mechanical shutter 52 is closed, such a component does not appear in an output signal.

In contrast, a problem may occur in the high-speed imaging period for automatic controls such as monitoring, an automatic iris control, an automatic focus control, and an automatic white balance control. This is because a signal in excess of the handlable charge amount of the vertical CCDs 13 or blooming or a like component appears since the mechanical shutter 52 is open, and there is no period in which to sweep and discard the related charges. In view of the above, in the invention, the saturation signal charge amount Qs is increased in advance in anticipation of the amount of its reduction by lowering the substrate bias Vsub at least during the signal charge readout period, i.e., during the all pixels readout period.

The control signal for lowering the substrate bias Vsub, i.e., the above-mentioned substrate bias control signal VsubCont., is output from the system controller 56, for instance. Alternatively, the substrate bias control signal VsubCont. may be output from the timing control circuit 19. As described above, when the substrate bias control signal VsubCont. is applied to the base of the bipolar transistor Q2 via the resistor R2 (see FIG. 4), the substrate bias Vsub is reduced by a voltage corresponding to the resistance of the resistor R3. This potential reduction is set in consideration of a reduction in the potential difference of the overflow barrier OFB (see FIG. 6) in the sensor sections 11 during the light interruption.

By lowering the substrate bias Vsub at least during the all pixels readout period as mentioned above, the potential of the overflow barrier OFB in the sensor sections 11 is reduced as much, whereby the saturation signal charge amount Qs (in terms of its value before it decreases over time during the light interruption) can be increased in anticipation of the amount of its reduction, as a result of which the saturation signal charge amount Qs thereafter can also be increased. Therefore, such characteristics as the S/N ratio and the dynamic range can be prevented from being deteriorated due to the reduction of the saturation signal charge amount Qs.

Four specific examples of the timing for starting to lower the substrate bias Vsub will be described below with reference to the timing charts of FIGS. 11–14.

Figure 10:
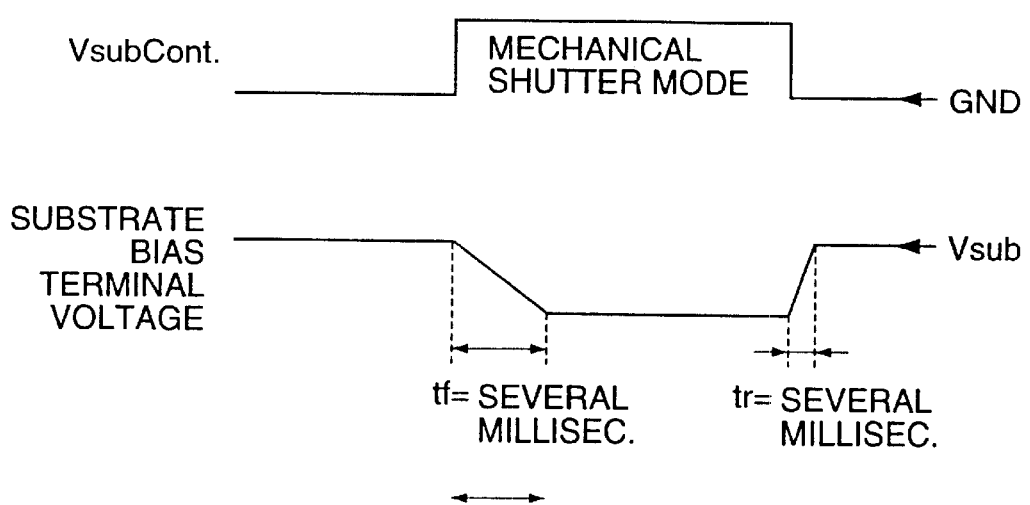
FIG. 10 is a timing chart of a substrate bias control.

First, in specific example-1 shown in FIG. 11, the start point of lowering the substrate bias Vsub is set before the start of an exposure. This measure enables compensation of the reduction of the saturation signal charge amount in all the periods including the exposure period. Therefore, this measure can even accommodate a signal that is saturated in part of the exposure period as in the case of strobe light. The reason why in FIG. 11 the substrate bias control signal VsubCont. is applied at the point several milliseconds before the completion of an exposure is that as shown in FIG. 10 a time of several milliseconds elapses from the application of the substrate bias control signal VsubCont. to the actual fall of the substrate bias Vsub due to a time constant that is determined by the resistance of the resistor R1 and the capacitance of the capacitor C (see FIG. 4).

Next, in specific example-2 shown in FIG. 12, the start point of lowering the substrate bias Vsub is set within the exposure period. This measure enables compensation of the reduction of the saturation signal charge amount Qs during the period when the mechanical shutter 52 is closed. The fact that the start point of lowering the substrate bias Vsub is not set before the start of an exposure unlike the case of FIG. 11 provides an advantage that the time from the turn-on of the trigger signal TRIG. (depression of the shutter release button of the camera) to the closure of the mechanical shutter 52 (completion of the exposure) is short (see FIG. 12).

Figure 13:
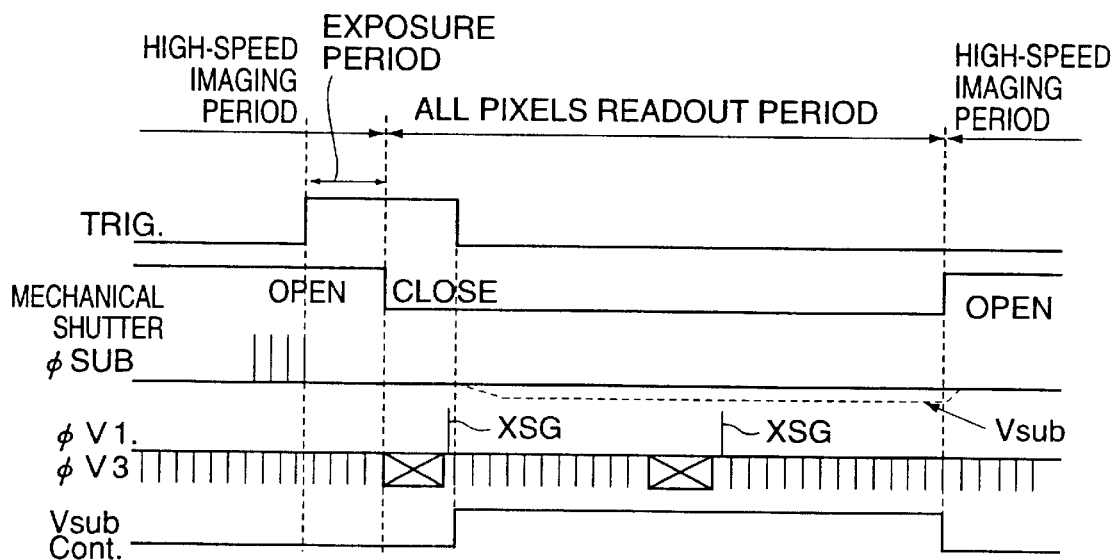
FIG. 13 is a timing chart of specific example-3.

In specific example-3 shown in FIG. 13, the start point of lowering the substrate bias Vsub is set within the period from the readout of signal charges in the first field to the read out of signal charges in the second field. In this measure, although the saturation signal charge amount Qs decreases until the readout of signal charges in the first field, the reduction of the saturation signal charge amount Qs in the second field can be prevented. Therefore, the difference between the saturation signal charge amounts Qs of the first and second fields (level difference) can be eliminated, which is a problem of the prior art.

Figure 14:
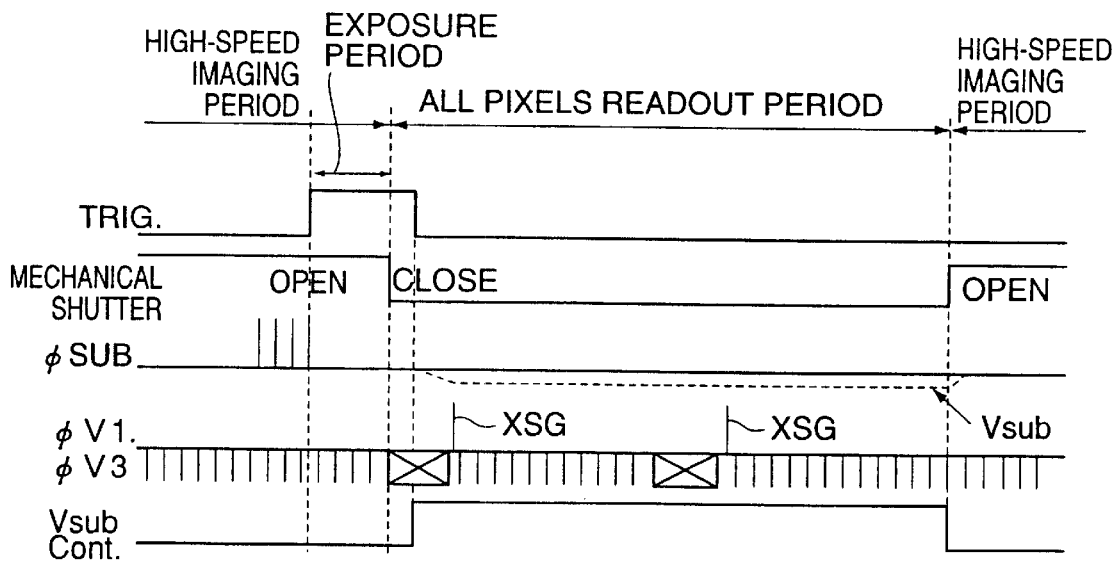
FIG. 14 is a timing chart of specific example-4.

In the specific example-4 shown in FIG. 14, the start point of lowering the substrate bias Vsub is set within the period from the completion of an exposure to the readout of signal charges. In this measure, although there exists a partial period during which the saturation signal charge amount Qs decreases, blooming or a like component that occurs in the exposure period due to the lowering of the substrate bias Vsub is reduced and hence the sweep/discard that is performed immediately after the completion of an exposure is facilitated.

Although the above embodiment is directed to the case of the frame readout scheme, the signal charge readout method may be the field readout scheme or the all pixels readout scheme. Although in the above embodiment the mechanical shutter 52 is used as the light interrupting means, the light interrupting means is not limited to it and may be other types such as a liquid crystal shutter. The invention can even be applied to a case where no light interruption is effected, for example, a case where after a light source once emits light a dark state continues over a given period, as in the case of using strobe light.

Further, in the above embodiment, in the case where the substrate bias generation circuit 20 and the clamping circuit 21 are incorporated in the CCD solid-state imaging device 10, the substrate bias Vsub is lowered at least during the signal charge readout period by making a selection, i.e., switching, as to whether to ground the input end (base of the bipolar transistor Q1) of the clamping circuit 21 via the resistor R3 by using the substrate bias control signal Vsub-Cont. The invention can similarly be applied to a case where the substrate bias generation circuit 20 and the clamping circuit 21 are provided outside the CCD imaging device 10.

Figure 15:
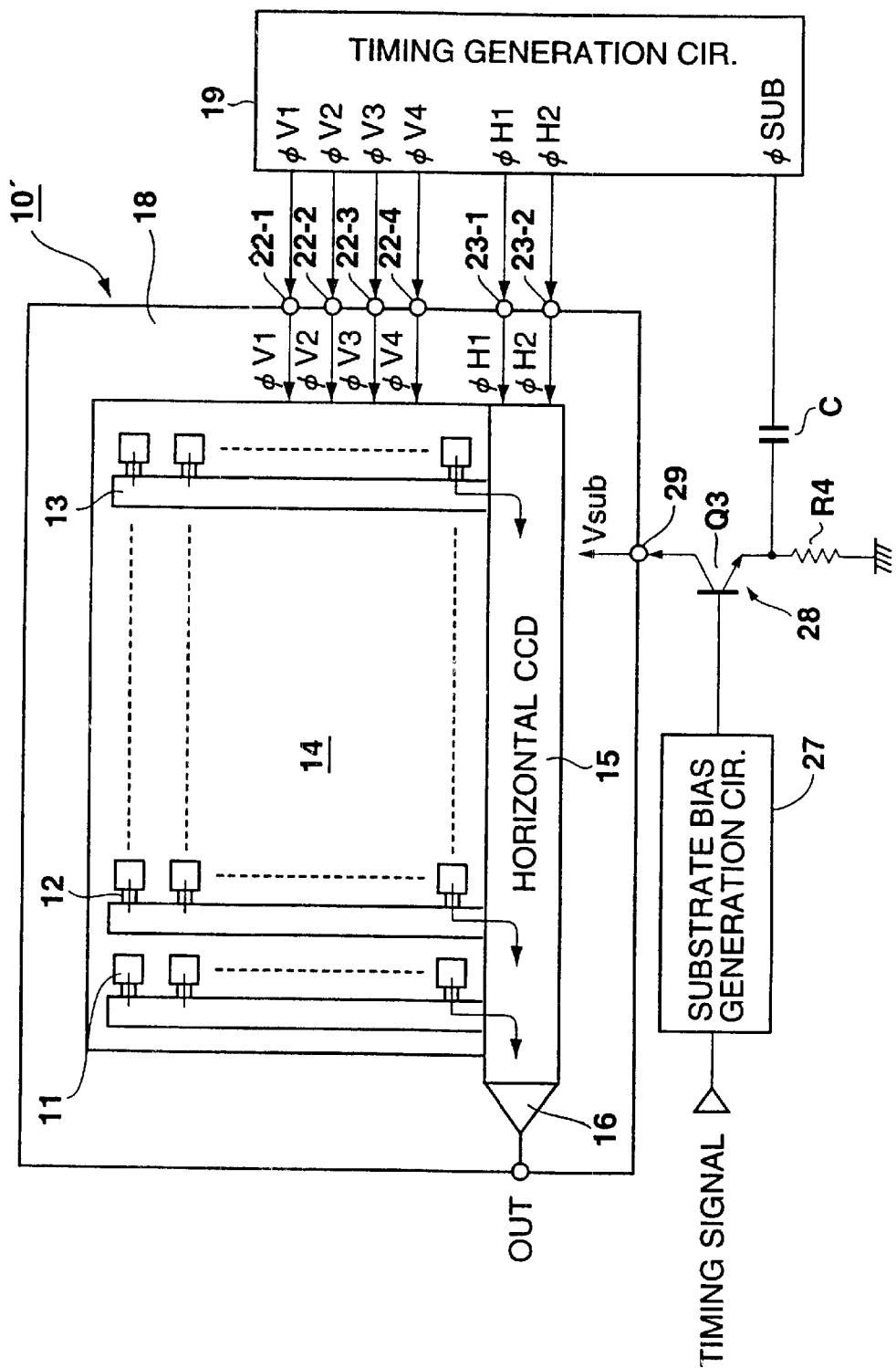
FIG. 15 shows a general configuration of a modification according to the invention.

FIG. 15 shows a configuration of such a case. In FIG. 15, the basic configuration of a CCD imaging device 10' is the same as that of the CCD imaging device 10 of the above embodiment. A substrate bias generation circuit 27 for generating a substrate bias Vsub is provided outside the CCD imaging device 10'. The substrate bias Vsub generated by the substrate bias generation circuit 27 is applied to the base of a bipolar transistor Q3 that constitutes a clamping circuit 28.

The collector of the bipolar transistor Q3 is connected to a terminal 29, and its emitter is grounded via a resistor R4. With this configuration, the substrate bias Vsub is applied to the substrate 18 via the terminal 29 after being subjected to impedance conversion by the bipolar transistor Q3. On the other hand, a shutter pulse φSUB that is generated by the timing control circuit 19 is DC-cut by a capacitor C and then applied to the emitter of the bipolar transistor Q3. At this time, the low level of the shutter pulse φSUB is clamped to the DC level of the substrate bias Vsub by the bipolar transistor Q3.

In the solid-state imaging apparatus in which the substrate bias generation circuit 27 and the clamping circuit 28 are provided outside the CCD imaging device 10', the substrate bias Vsub may be lowered in the following manner. A timing signal for lowering the substrate bias Vsub itself during a given period is applied to the substrate bias generation circuit 27. Upon reception of the timing signal, the substrate bias generation circuit 27 outputs, during the given period, a substrate bias Vsub that is lower than the normal potential by a given value. The timing for starting to lower the substrate bias Vsub may be set in the same manner as in specific example-1 to 4 in the above embodiment.

The above embodiment is directed to the case where the invention is applied to the CCD imaging device having the vertical overflow drain structure and the substrate bias Vsub that is applied to the substrate 18 serving as the overflow drain is lowered at least during the signal charge readout period. The invention can similarly be applied to a CCD imaging device having the horizontal overflow drain structure, in which case the overflow drain bias may directly be lowered at least during the signal charge readout period.

As described above, according to the invention, in the solid-state imaging device in which the sensor sections have the overflow drain structure, the saturation signal charge amount (in terms of the value before it decreases over time during light interruption) can be increased in anticipation of the amount of its reduction because the overflow drain bias of the solid-state imaging device is lowered at least during the signal charge readout period. Therefore, it becomes possible to prevent such characteristics as the S/N ratio and the dynamic range from being deteriorated due to reduction of the saturation signal charge amount that occurs in a period from completion of an exposure to readout of signal charges.

What is claimed is:

1. A solid-state imaging apparatus comprising:
   a solid-state imaging device having a plurality of sensor sections that have an overflow drain structure and are arranged in matrix form, and a charge transfer section for transferring signal charges read out from the sensor sections;
   a shutter effective to prevent light from irradiating the sensor sections; and
   a driving system for performing a drive operation so as to lower an overflow drain bias of the solid-state imaging device directly in response to a timing signal, in anticipation of a decrease in a saturation signal charge amount of said sensor sections, and regardless of the amount of incident light during an exposure period, wherein said overflow drain bias is lowered at least during a signal charge readout period in a given operating mode during which said signal charges are read out from said sensor sections, said shutter being closed during said readout period, thereby increasing the saturation signal charge amount of said sensors sections.

2. The solid-state imaging apparatus according to claim 1, wherein in the driving system a start point of lowering the overflow drain bias is set before a start of an exposure.

3. The solid-state imaging apparatus according to claim 1, wherein in the driving system a start point of lowering the overflow drain bias is set within an exposure period.

4. The solid-state imaging apparatus according to claim 1, wherein in the driving system a start point of lowering the overflow drain bias is set within a period from readout of signal charges in a first field to readout of signal charges in a second field.

5. The solid-state imaging apparatus according to claim 1, wherein in the driving system a start point of lowering the overflow drain bias is set within a period from completion of an exposure to readout of signal charges.

6. The solid-state imaging apparatus of claim 1, including a substrate bias voltage generating circuit, said driving system being configured such that said driving system generates a substrate bias control signal which is applied to said substrate bias voltage generating circuit at least during said readout period to effect such lowering of the overflow drain bias.

7. The solid-state imaging apparatus of claim 6, wherein said substrate bias control signal is applied to said substrate bias voltage generating circuit during a time period beginning before said shutter is closed.

8. The solid-state imaging apparatus of claim 6, wherein said substrate bias control signal is applied to said substrate bias voltage generating circuit during a time period beginning after said shutter is closed.

9. The solid-state imaging apparatus of claim 6, wherein said substrate bias control signal is applied to said substrate bias voltage generating circuit during a time period ending when said shutter is reopened.

10. The solid-state imaging apparatus according to claim 1, wherein said overflow drain bias is lowered by a predetermined amount.

11. The solid-state imaging apparatus of claim 1 wherein said driving system performs a drive operation so as to switch said overflow drain bias of the solid-state imaging device between two states.

12. A method for driving a solid-state imaging apparatus comprising a solid-state imaging device having a plurality of sensor sections that have an overflow drain structure and are arranged in matrix form, and a charge transfer section for transferring signal charges read out from the sensor sections, the method comprising the steps of:
   lowering an overflow drain bias of the solid-state imaging device directly in response to a timing signal, in anticipation of a decrease in a saturation signal charge amount of said sensor sections, and regardless of the amount of incident light during an exposure period, wherein said lowering occurs at least during a signal readout period in a given operation mode, thereby increasing the saturation signal charge amount of said sensors sections; and
   closing a shutter to prevent light from irradiating the sensors.

13. The driving method according to claim 12, wherein a start point of lowering the overflow drain bias is set before a start of an exposure.

14. The driving method according to claim 12, wherein a start point of lowering the overflow drain bias is set within an exposure period.

15. The driving method according to claim 12, wherein a start point of lowering the overflow drain bias is set within a period from readout of signal charges in a first field to readout of signal charges in a second field.

16. The driving method according to claim 12, wherein a start point of lowering the overflow drain bias is set within a period from completion of an exposure to readout of signal charges.

17. The method of claim 12, comprising the further step of generating a substrate bias control signal and applying same to a substrate bias voltage generating circuit at least during said readout period to effect such lowering of the overflow drain bias.

18. The method of claim 17, comprising the further step of generating a substrate bias control signal and applying same to a substrate bias voltage generating circuit during a time period beginning before said shutter is closed.

19. The method of claim 17, comprising the further step of generating a substrate bias control signal and applying same to a substrate bias voltage generating circuit during a time period beginning after said shutter is closed.

20. The solid-state imaging apparatus of claim 17, wherein said substrate bias control signal is applied to said substrate bias voltage generating circuit during a time period ending when said shutter is reopened.

21. The driving method according to claim 12 wherein the lowering step comprises lowering said overflow drain bias by a predetermined amount.

22. The method for driving a solid-state imaging apparatus of claim 12 wherein said lowering step comprises switching said overflow drain bias of the solid-state imaging device between two states at least during a signal readout period in a given operation mode, thereby increasing saturation signal charge amount of said sensors.

23. A camera comprising:
   a solid-state imaging device having a plurality of sensor sections that have an overflow drain structure and are arranged in matrix form, and a charge transfer section for transferring signal charges read out from the sensor sections; and
   a driving system for performing a drive operation so as to lower an overflow drain bias of the solid-state imaging device directly in response to a timing signal, in anticipation of a decrease in a saturation signal charge amount of said sensor sections, and regardless of the amount of incident light during an exposure period, wherein said overflow drain bias is lowered at least during a signal charge readout period in a given operating mode during which said signal charges are readout from said sensor sections, thereby increasing the saturation signal charge amount of said sensors sections;
   an optical system for guiding light to an imaging area of the solid-state imaging device; and
   light interrupting means for determining an exposure period by interrupting the light incident to prevent it from reaching the imaging area of the solid-state imaging device, said light interrupting means including a shutter which is closed during said readout period.

24. The camera of claim 23, further comprising a substrate bias voltage generating circuit associated with said solid-state imaging device, said driving system being configured such that said driving system generates a substrate bias control signal which is applied to said substrate bias voltage generating circuit at least during said readout period to effect such lowering of the overflow drain bias.

25. The camera of claim 24, wherein said substrate bias control signal is applied to said substrate bias voltage generating circuit during a time period beginning before said shutter is closed.

26. The camera of claim 24, wherein said substrate bias control signal is applied to said substrate bias voltage generating circuit during a time period beginning after said shutter is closed.

27. The camera of claim 24, wherein said substrate bias control signal is applied to said substrate bias voltage generating circuit during a time period ending when said shutter is reopened.

28. The camera of claim 23, wherein said overflow drain bias is lowered by a predetermined amount.

29. The camera of claim 23 wherein said driving system performs a drive operation so as to switch said overflow drain bias of the solid-state imaging device between two states.

* * * * *